United States Patent [19]
May et al.

[11] Patent Number: 6,071,749
[45] Date of Patent: Jun. 6, 2000

[54] PROCESS FOR FORMING A SEMICONDUCTOR DEVICE WITH CONTROLLED RELATIVE THICKNESSES OF THE ACTIVE REGION AND GATE ELECTRODE

[75] Inventors: Charles E. May; Robert Dawson, both of Austin, Tex.

[73] Assignee: Advanced Micro Devices, Inc., Sunnyvale, Calif.

[21] Appl. No.: 08/995,024

[22] Filed: Dec. 19, 1997

[51] Int. Cl.$^7$ ...................................................... H01L 21/66
[52] U.S. Cl. ................................................. 438/11; 438/18
[58] Field of Search .............................. 438/6, 7, 10, 11, 438/14, 16, 17, 18

[56] References Cited

U.S. PATENT DOCUMENTS

| | | | |
|---|---|---|---|
| 4,672,314 | 6/1987 | Kokkas | 438/18 |
| 4,978,627 | 12/1990 | Liu et al. | 438/17 |
| 5,252,508 | 10/1993 | Masuda | 438/6 |
| 5,863,807 | 1/1999 | Jang et al. | 438/18 |

*Primary Examiner*—Chandra Chaudhari

[57] ABSTRACT

In a semiconductor device fabrication process, a first semiconductor device is constructed with a gate electrode and an active (e.g., source/drain) region. The thickness of the active region is determined. A second semiconductor device is constructed with the same gate electrode and active region dopant concentrations as the first device and is generally the same as the first device except for the thickness of the gate electrode. Using the determined thickness of the active region of the first device, the thickness of the gate electrode of the second device is controlled so that it differs from the thickness of the active region of the second device by a desired amount.

18 Claims, 3 Drawing Sheets

PROCESS FOR FORMING A SEMICONDUCTOR DEVICE WITH CONTROLLED RELATIVE THICKNESSES OF THE ACTIVE REGION AND GATE ELECTRODE

FIELD OF THE INVENTION

The present invention is directed generally to a method of manufacturing a semiconductor device and, more particularly, to a method of forming a semiconductor device with controlled relative thicknesses of the active region and gate electrode.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 adjacent to the gate electrode 103 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

Generally, the source/drain region 105 is formed by implanting dopant into the substrate to form the active regions. The substrate is typically annealed to drive the dopant deeper into the substrate 106 and to provide an approximately uniformly doped source/drain region 105.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

The gate electrode 103 is provided with a specific thickness and is typically uniformly doped throughout that thickness. The source/drain region 105 is typically doped at a desired concentration without particular regard for the thickness of the region 105. The thickness of the source/drain region is generally a function of the dopant concentration and energy levels, as well as the heat processing to which the wafer is subjected after implantation of the dopant.

Increasingly smaller semiconductor devices are being produced often because these devices have improved performance over larger devices and to increase the overall functionality that can be placed on a single chip. One such area of improved performance is the speed of the semiconductor device (e.g., the switching time of a transistor). As devices become smaller, the arrangement, relative orientation, and size of each part of the device (e.g., the gate electrode 103 and the source/drain region 105 of MOS device 100) become more critical and may significantly affect the properties of the device, including diminishing or negating the advantages of using a smaller device. Thus, there is a need for developing methods and techniques for use in the fabrication of smaller, high performance semiconductor devices while reducing negative influences which impact the overall performance of such devices.

SUMMARY OF THE INVENTION

Generally, the present invention relates to a method of forming a semiconductor device having controlled relative thicknesses of the active region and the gate electrode.

In accordance with one embodiment of the invention, a semiconductor device having gate electrodes and at least one active region corresponding to each gate electrode is made by forming a first gate electrode on a first substrate and then doping the first gate electrode. A first doped active region with a predetermined dopant concentration is formed on the first substrate adjacent to the first gate electrode. The thickness of the first doped active region is determined. This determined thickness is used to determine the thickness of a second gate electrode that is formed on a second substrate. A second doped active region with the same predetermined dopant concentration as the first doped active region is formed on the second substrate adjacent to the second gate electrode. Application of this process creates a semiconductor device in which the second gate electrode and the second doped active region have controlled relative thicknesses.

In one particular embodiment of the invention, the thickness of the second gate electrode is determined based on the thickness of the first doped active region so that the second gate electrode and second doped active region have substantially equivalent thickness.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
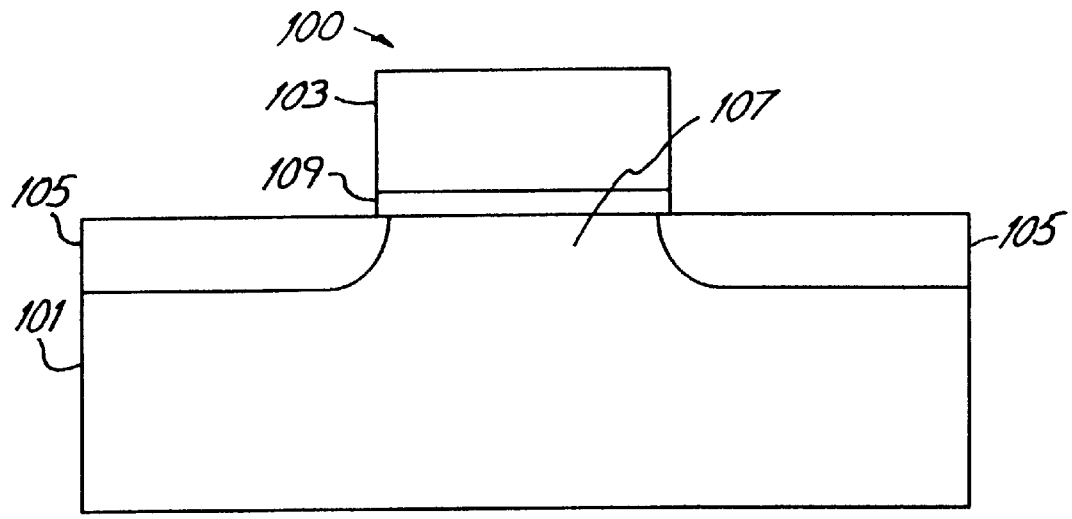
FIG. 1 illustrates one typical MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS structures. The present invention is believed to be particularly suited for controlling the relative thicknesses of gate electrodes and corresponding active regions of MOS devices. While the present invention is not so limited, an appreciation of various aspects of the invention will be gained through a discussion of the fabrication process and characteristics of such a device in connection with the examples provided below.

One embodiment of the invention is the fabrication of semiconductor devices with reduced capacitance. Capacitance within a semiconductor device will typically decrease the speed of the device. One particular source of capacitance in semiconductor devices is associated with the active region and is a function of the relative thicknesses of the gate electrode and the active (e.g., source/drain) region. Such capacitance can be reduced when the gate electrode and the active region have equivalent thickness.

One aspect of the present invention is a method for making a semiconductor device with controlled relative thicknesses of the active region and gate electrode. The method includes forming a first semiconductor device with a gate electrode and active region and measuring the thickness of the active region. A second device is fabricated using the same general process as the first device except that the thickness of the gate electrode is altered based on the measurement of the active region of the first device so that the gate electrode and the active region of the second device have controlled relative thicknesses.

Figure 2:
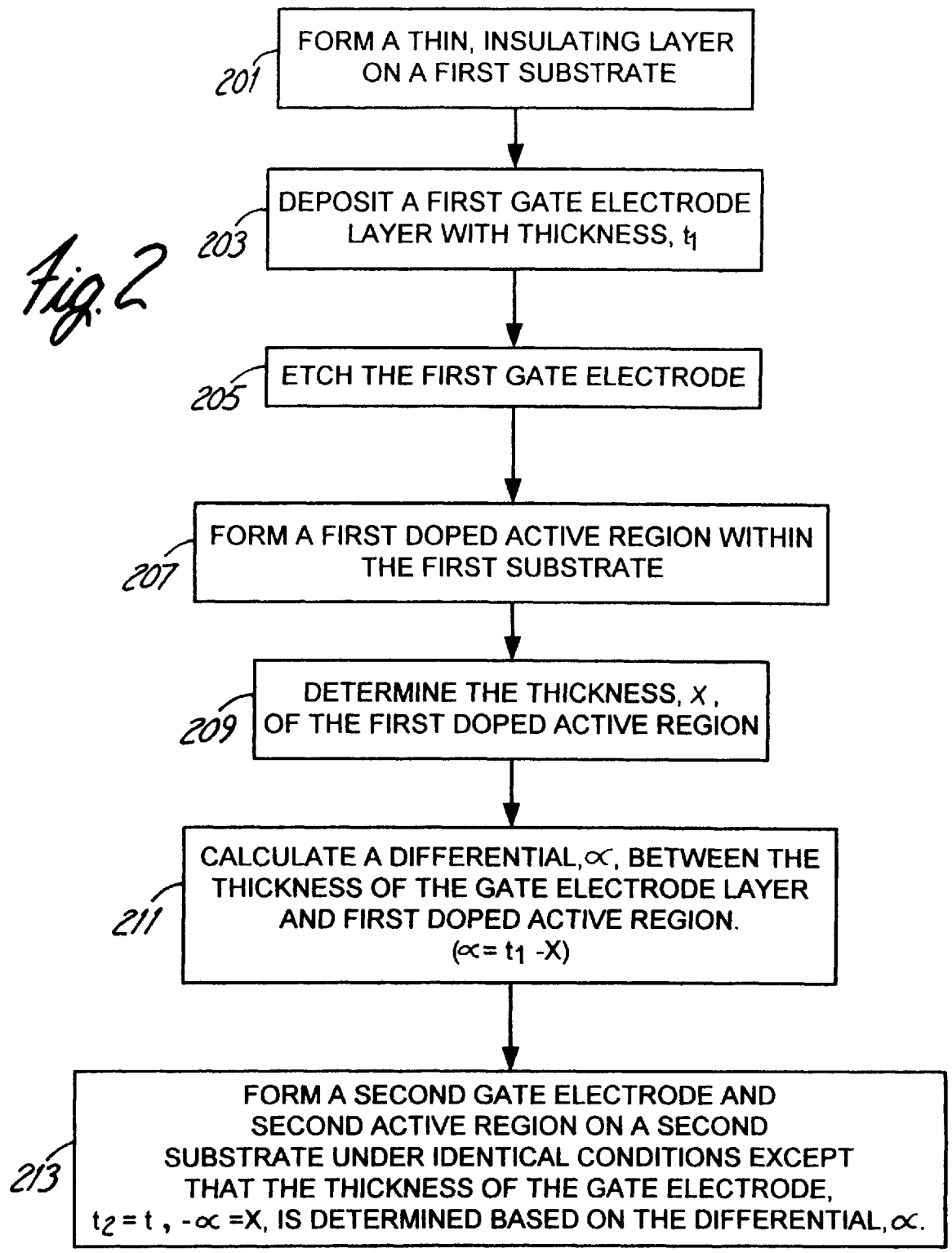
FIG. 2 is a flow chart of the steps of one embodiment of a method for forming a semiconductor device with an active region and gate electrode having controlled relative thicknesses.
Figure 3:
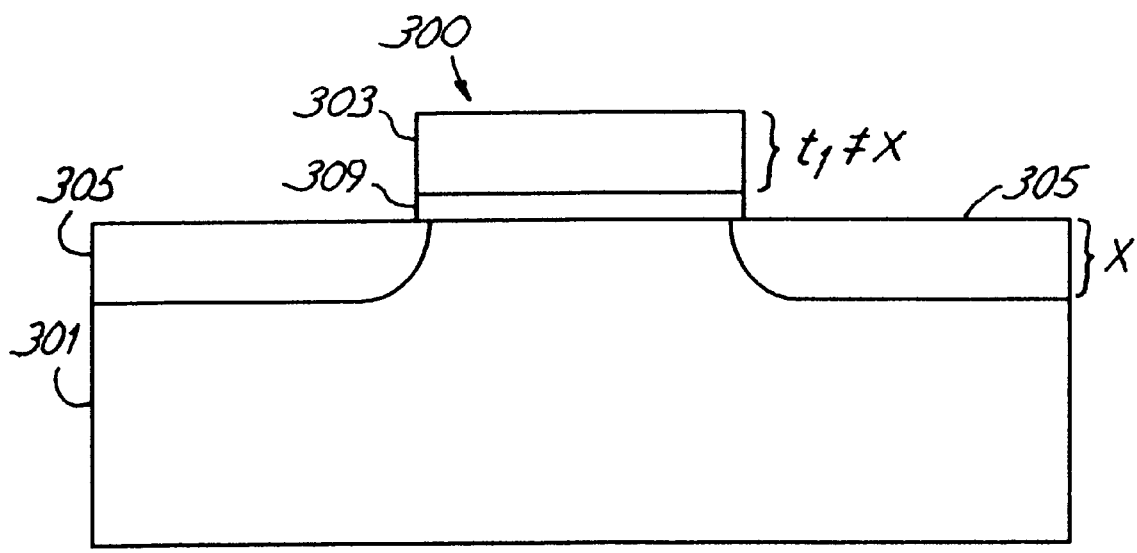
FIG. 3 illustrates a semiconductor device having uncontrolled relative thicknesses of the active region and gate electrode.
Figure 4:
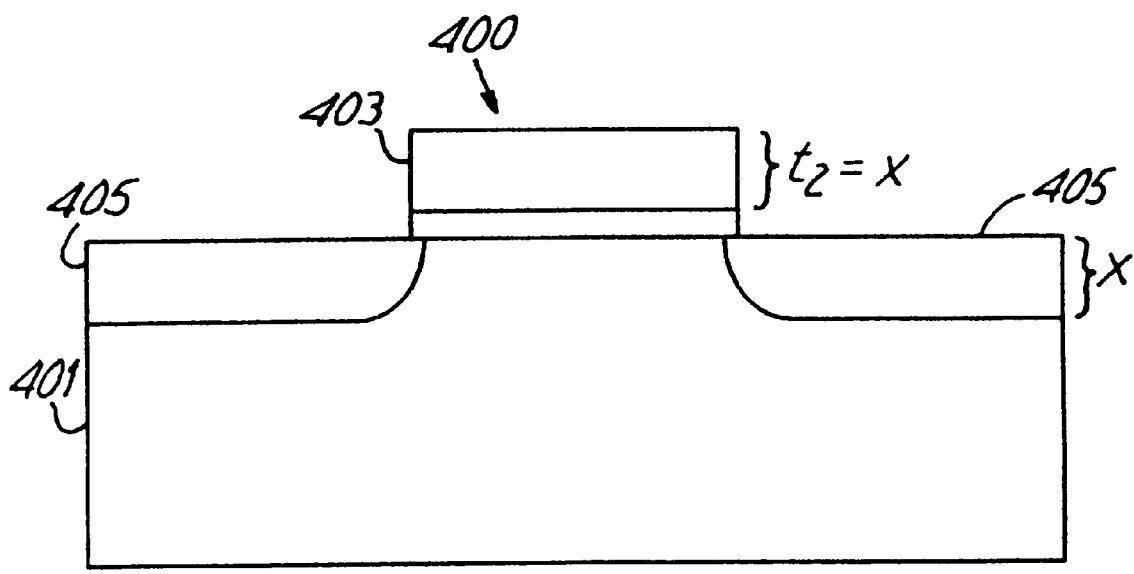
FIG. 4 illustrates one embodiment of a semiconductor device formed in a manner identical to the device of FIG. 3 except that the thickness of the gate electrode is altered based on the thickness of the active region of the device of FIG. 3.

Referring to the drawings in general, and FIGS. 2–4 in particular, FIG. 2 provides a flow chart of one embodiment of a method for forming a semiconductor device with controlled relative thicknesses of the source/drain region and gate electrode. Steps 201–213 of the method will be indicated in the following discussion. A first semiconductor device 300, illustrated in FIG. 3, is constructed by forming a thin insulating layer 309 on a substrate 301 (step 201 of FIG. 2). In one embodiment of the invention, the substrate is silicon and the thin insulating layer is silicon dioxide. Other materials known to those skilled in the art can also be used. For example, appropriate materials may be chosen to create an SOI (silicon-on-insulator) device.

A gate electrode layer is deposited over the insulating layer 109 (step 203) and etched to form a gate electrode 303 using standard techniques known to those skilled in the art (step 205). In one embodiment of the invention the gate electrode layer and gate electrode 303 are made of polysilicon. Other non-polysilicon gate electrodes, such as nitrided gate electrodes, may be used. The gate electrode layer, and consequently the gate electrode 303, is formed with a generally controllable thickness, $t_1$. The gate electrode 303 is doped to a desired gate dopant concentration.

An active region 305, for example, a source/drain region, is formed in the substrate 301 by doping a region of the substrate adjacent to the gate electrode 303 with a desired dopant concentration (step 207). In one embodiment of the invention, the dopant concentrations of the gate electrode 303 and the active region 305 are identical or nearly identical.

Both the gate electrode 303 and active region 305 are doped using standard methods and techniques known to those skilled in the art, such as diffusional doping and ion implantation. In one embodiment of the invention, the dopant concentrations throughout the gate electrode 303 and the active region 305 are uniform within each of those structures. Uniformity of dopant concentration can be obtained by annealing techniques, such as Rapid Thermal Processing (RTP), which permit diffusion of the dopant through the substrate.

After the gate electrode 303 and active region 305 have been formed, the thickness, x, of the active region 305 is determined. Several methods of determining this thickness are available and known to those skilled in the art. One such method is secondary ion mass spectroscopy (SIMS). The SIMS method measures the thickness of the active region 305 by bombarding the active region 305 with a beam of high-energy ions which causes the ejection of ionized atoms from the surface of the region 305. The mass of the ejected ionized atoms is then determined by a mass spectrometer and correlated to the concentration of each specific type of atom in the region being measured. For example, if boron is used to dope the active region 305, then a measurement of a $^{11}B^+$ signal by the mass spectrometer can be correlated to the amount of boron in the doped region 305.

Over time, the beam of ions continues to remove atoms from the surface upon which it impinges. If the beam is not moved it eventually creates a hole in the doped region. A doping profile of this region can be obtained by observing the concentration of the ejected dopant ions over time. From this doping profile, a doping thickness can be determined. In one embodiment of the invention, the active region 305 is uniformly doped so that the thickness of the region can be defined as, for example, the distance from the surface of the substrate at which the doping concentration begins to decrease.

Alternatively, the thickness of the region can be defined as the distance from the substrate surface at which the dopant concentration falls, for example, to 10%, 50%, or 90% of the maximum concentration. It can be appreciated that there are many other ways of defining the thickness.

Using the thickness, x, of the active (i.e., source/drain) region 305, a thickness of a gate electrode of a second semiconductor device can be controlled based on the desired relative thicknesses of the gate electrode and active region of the second device. In one embodiment of the invention, it is desirable to construct a device with substantially equivalent gate electrode and active region thicknesses to reduce, for example, the above-described capacitance. Using the thickness, x, of the active (i.e., source/drain) region 305, a differential, a, between the thickness of the gate electrode 303, $t_1$, and the thickness of the active region 305 is determined ($a=t_1-x$). This differential is used in the fabrication of a second semiconductor device, 400, illustrated in FIG. 4. This device 400 is formed in the same manner as the first semiconductor device, 300, with the same active region and gate dopant concentrations, except that the thickness, $t_2$, of the gate electrode layer 403 of the second device 400 is chosen so that $t_2=t_1-a=x$. This second semiconductor device 400, therefore, has a gate electrode 403 and an active region 405 with substantially equivalent thicknesses. The gate electrode thickness, $t_2$, can then be used in the fabrication line to produce multiple semiconductor devices having equivalent active region and gate electrode thicknesses.

The gate electrode 403 of the second semiconductor device 400 will be either thinner or thicker than gate electrode 303. If a>0 (i.e., the thickness of the gate electrode 303 of the first semiconductor device 300 is greater than the thickness of the active region 305), gate electrode 403 of the second semiconductor device 400 is thinner than gate electrode 303. Conversely, if a<0 (i.e., the thickness of gate electrode 303 is less than the thickness of active region 305), gate electrode 403 is thicker than gate electrode 303.

The above describe fabrication techniques for forming a semiconductor device with an active region and a gate electrode having controlled relative thickness can be used with semiconductor devices other than the MOSFET device discussed above. For example, the procedure can be used with a MOSFET device having active regions that include lightly-doped-drain (LDD) structures. Such active regions have a lightly-doped, lower conductivity portion near the channel region and a heavily-doped portion connected to the source/drain terminal. Although the thickness of the active region can be measured from any point in that region, so long as the choice of measurement position is uniform among similar devices, the thickness of the heavily-doped portion of the active region is most often measured and compared with the thickness of the gate electrode.

Another device which can benefit from this procedure is a MOSFET device with asymmetrical source and drain regions (i.e., the dopant concentrations of the source and drain regions are not equivalent). The thickness of either the source or the drain region can be used in this procedure for the "thickness", x, of the active region In one embodiment of the invention, the thickness of the most heavily doped region, often the source, is measured. The gate electrode of the device is then constructed to provide a thickness that differs from this measured "thickness" of the active region by the desired amount.

Figure 5:
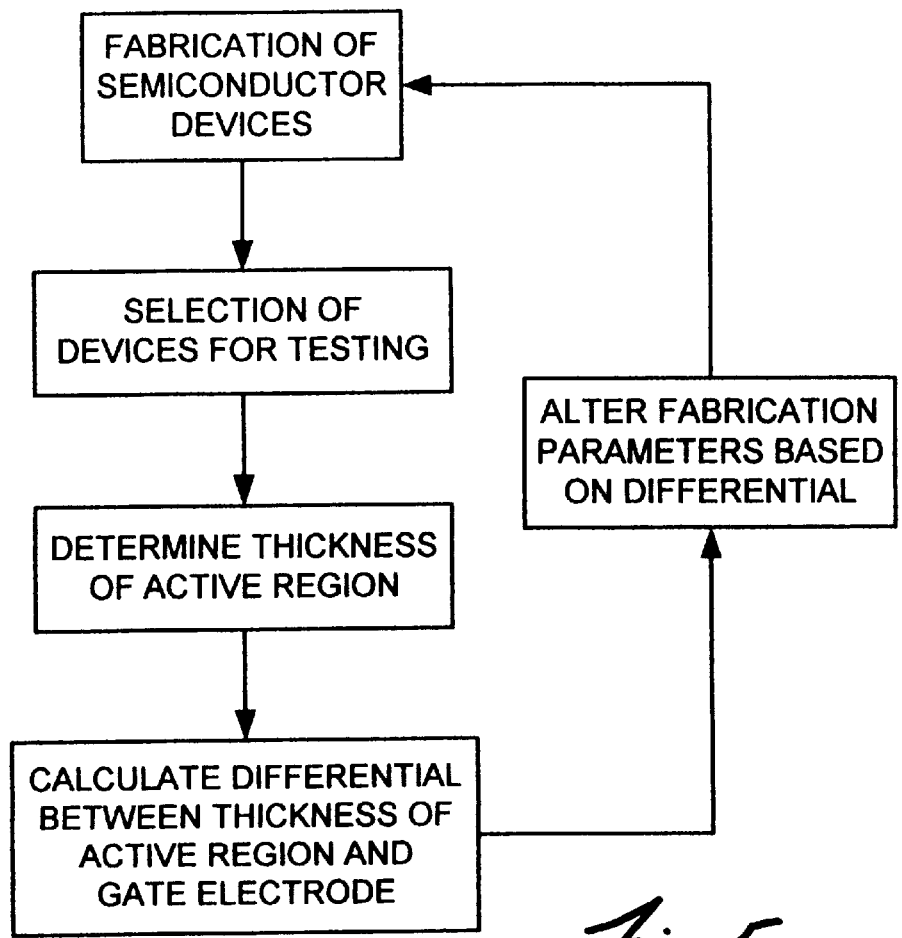
FIG. 5 shows a flow chart of one embodiment of a method for providing feedback to the fabrication line based on the determination of the relative gate electrode and active region thicknesses of devices from that line.

The thickness of the active region (i.e., source/drain region) can be measured by techniques other than SIMS. SIMS is an invasive measurement technique where a portion of the semiconductor device is damaged during the measurement process. SIMS is typically used on selected samples to ensure quality control and to determine the structure of a device. For example, devices may be periodically selected from the fabrication line for measurement of the active region thickness by SIMS or any other measurement technique. This measurement may be taken at the same general time as other characteristics of a test device or wafer are determined. In accordance with one embodiment of the invention illustrated in FIG. 5, when a deviation in the thickness of the gate electrode as compared to the thickness of the source/drain region is determined, an automatic or manual adjustment in the fabrication parameters is made.

In contrast with SIMS, if a non-invasive measurement technique is used, then the semiconductor device is not damaged and may potentially be used by a consumer. In one particular embodiment, the measurement process employs the non-invasive technique as a part of the fabrication line to provide constant or periodic feedback to the line using a procedure such as that shown in FIG. 5. The results of the measurement process can be communicated to the processing machinery to alter the fabrication parameters in accordance with those results. This procedure could be applied to every semiconductor device of a fabrication line, or alternatively, devices could be chosen at regular intervals or randomly to ensure that the devices are correctly formed (i.e., the thicknesses of the gate electrode and source/drain region have the correct relative thickness). One such non-invasive measurement technique uses a Raman probe and is described in co-pending patent application Ser. No. 08/995, 022 (Docket No. AMDA. 412PA), filed Dec. 19, 1997, entitled "Apparatus and Method for Determining Depth Profile Characteristics of a Dopant Material in a Semiconductor Device", the contents of which are incorporated herein by reference.

As noted above, the present invention is applicable to the fabrication of semiconductor devices with controlled relative thicknesses of the gate electrode and active region. For example, while several of the above embodiments control the relative thicknesses of the gate electrode and active region to be substantially equal, it will be appreciated that the process could be used to obtain other relationships of relative gate electrode and active region thickness as desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process for forming a semiconductor device having at least one gate electrode and at least one active region corresponding to each gate electrode, the process comprising:

forming a first gate electrode on a first substrate;

doping the first gate electrode;

forming a first doped active region having a predetermined dopant concentration on the first substrate adjacent the first gate electrode;

determining a thickness of the first doped active region; and forming a second gate electrode on a second substrate having a thickness and forming a second doped active region having the predetermined dopant concentration on the second substrate adjacent the second gate electrode, the thickness of the second gate electrode being determined using the thickness of the first doped active region such that the thickness of the second gate electrode and a thickness of the second doped active region are substantially equal.

2. The method of claim 1, wherein the first gate electrode has a thickness and the method further comprises calculating a difference between the thickness of the first gate electrode and the thickness of the first doped active region and wherein the thickness of the second gate electrode is determined using the calculated difference between the thickness of the first gate electrode and the thickness of the first doped active region.

3. The method of claim 1, wherein the first and second gate electrodes comprise polysilicon.

4. The method of claim 1, wherein the thickness of the first doped active region is measured invasively.

5. The method of claim 4, wherein the thickness of the first doped active region is measured by secondary ion mass spectroscopy (SIMS).

6. The method of claim 1, wherein the first and second gate, electrodes are doped by ion implantation.

7. The method of claim 1, wherein the first and second doped active regions are doped by ion implantation.

8. The method of claim 7, wherein the first doped active region is annealed subsequent to being doped but prior to the determination of its thickness.

9. The method of claim 1, wherein the first and second substrates are silicon.

10. The method of claim 1, wherein the first and second active regions comprise source/drain regions.

11. The method of claim 1, wherein the first and second active regions comprise source regions.

12. The method of claim 1, wherein the first and second doped active regions are uniformly doped.

13. The method of claim 1, wherein the first and second gate electrodes have a gate dopant concentration equal to the predetermined dopant concentration.

14. The method of claim 1, wherein the first and second doped active regions comprise a lightly doped region and a heavily doped region.

15. The method of claim 14, wherein determining a thickness of the first doped active region comprises determining a thickness of the heavily doped region of the first doped active region.

16. The method of claim 14, wherein the first and second doped active regions comprise LDD structures.

17. A process for forming a semiconductor device having at least one gate electrode and at least one active region corresponding to each gate electrode, the process comprising:

forming a gate electrode on a substrate, the gate electrode having a thickness determined by
forming a test gate electrode on a test substrate,
doping the test gate electrode,
forming a test doped active region having a predetermined dopant concentration on the test substrate adjacent the test gate electrode,
determining a thickness of the test doped active region, and
determining the thickness of the gate electrode using the thickness of the test doped active region such that the thickness of the gate electrode and the thickness of the test doped active region are substantially equal;

doping the gate electrode; and forming a doped active region having the predetermined dopant concentration on the substrate adjacent the gate electrode, such that a thickness of the doped active region and the thickness of the gate electrode are substantially equal.

18. A process for forming a semiconductor device having at least one gate electrode and at least one active region corresponding to each gate electrode, the process comprising:

forming a first gate electrode on a first substrate;

doping the first gate electrode;

forming a first doped active region having a predetermined dopant concentration on the first substrate adjacent the first gate electrode;

determining a thickness of the first doped active region; and forming a second gate electrode on a second substrate having a thickness and forming a second doped active region having the predetermined dopant concentration on the second substrate adjacent the second gate electrode, the thickness of the second gate electrode being determined using the thickness of the first doped active region such that the thickness of the second gate electrode is controlled to produce a predetermined thickness relative to a thickness of the second doped active region.

* * * * *